United States Patent [19]

Katsuyama et al.

[11] Patent Number: 5,734,671
[45] Date of Patent: Mar. 31, 1998

[54] SEMICONDUCTOR LASER DIODE

[75] Inventors: Tsukuru Katsuyama; Ichiro Yoshida; Jun-Ichi Hashimoto; Michio Murata, all of Yokohama, Japan

[73] Assignee: Sumitomo Electric Industries, Ltd., Osaka, Japan

[21] Appl. No.: 522,959

[22] Filed: Sep. 1, 1995

[30] Foreign Application Priority Data

Sep. 2, 1994 [JP] Japan .................. 6-210097

[51] Int. Cl.$^6$ ................................ H01S 3/19
[52] U.S. Cl. ................................ 372/46; 372/45
[58] Field of Search ........................ 372/45, 46

[56] References Cited

U.S. PATENT DOCUMENTS

| 5,228,047 | 7/1993 | Matsumoto et al. | 372/49 |
| 5,363,392 | 11/1994 | Kasakawa et al. | 372/45 |
| 5,384,151 | 1/1995 | Razeghi | 427/58 |
| 5,389,396 | 2/1995 | Razeghi | 427/58 |

FOREIGN PATENT DOCUMENTS 7-131114  5/1995  Japan .

OTHER PUBLICATIONS

Zhang et al, "GSMBE Growth of GaInAsP on GaAs Substrates and its Application to 0.98 μm Lasers", Journal of Crystal Growth, vol. 127, Nos. 1/4, Feb. 1993, pp. 1033–1036.

Garbuzov et al, "High–Power Buried in GaAsP/GaAs (λ=0.8 μm) Laser Diodes", Applied Physics Letters, vol. 62, No. 10, Mar. 1993, pp. 1062–1064.

Shiau et al, "Low–Threshold 1.3–μm Wavelength, InGaAsP Strained–Layer Multiple Quantum Well Lasers Grown by Gas Source Molecular Beam Eptiaxy", Applied Physics Letters, vol. 65, No. 7, Aug. 1994, pp. 892–894.

Uchida et al, "1.3 μm InGaAs/GaAs Strained Quantum Well Lasers With InGaP Cladding Layer", Electronics Letters, Mar. 1994, vol. 30, No. 7, pp. 563–565.

Fujitsu Laboratories Ltd., "Visible Semiconductor Lasers With GaInAsP strained Quantum Well Active Layers", 1993 Autumn Meeting the 54th Meeting of the Japan Society of Applied Physics Extended Abstracts, p. 1049.

Primary Examiner—James W. Davie
Attorney, Agent, or Firm—Cushman Darby & Cushman IP Group of Pillsbury Madison & Sutro LLP

[57] ABSTRACT

A semiconductor laser diode which can be applied to optical fiber amplifiers to attain a high reliability and can generate light having a wavelength of about 1 μm is provided. This semiconductor laser diode is formed on a GaAs substrate and has an active layer comprising a GaInAsP strained quantum well whose energy band gap is smaller than that of GaAs. Barrier layers each comprising GaInAsP whose band gap is greater than that of the active layer are bonded to the active layer through heterojunction. According to this structure, when the active layer and the barrier layers are grown, the amounts of supply of a Ga material and an In material can be controlled in a simple manner and a semiconductor laser diode having a high reliability can be realized.

7 Claims, 5 Drawing Sheets

SEMICONDUCTOR LASER DIODE

BACKGROUND OF THE INVENTION

1. Field of the Invention

The present invention relates to a semiconductor laser diode used for excitation light of optical fiber amplifiers, optical fiber amplifier system and a method of making the laser diode.

2. Related Background Art

As semiconductor laser diode technology has developed, various types of new laser diodes are proposed. Such a new laser diodes are described in U.S. Pat. No. 5,389,396 or in the Extended Abstracts of the 54th Autumn Meeting of the Japan Society of Applied Physics pp. 1049, 1993.

SUMMARY OF THE INVENTION

In optical communication, when relays with optical fiber amplifiers which can directly amplifying the signal light are used, longer-distance transmission and larger capacity in optical transmission systems are obtained. Er-doped optical fiber amplifiers and Pr-doped fluoride fiber amplifiers can amplify the signal light.

In the Er-doped optical fiber amplifier, an optical fiber doped with erbium (Er) is used to amplify signal light at a wavelength band of 1.5 µm, while using a semiconductor laser diode having a wavelength of 1.48 µm or 0.98 µm as a pumping source for this amplification. The dopant in the optical fiber amplifier is excited by light of 0.98 µm semiconductor laser diode.

In the Pr-doped fluoride fiber amplifier, an optical fiber doped with praseodymium (Pr) amplifies the signal light at a wavelength band of 1.3 µm, while using a semiconductor laser diode having a wavelength of about 1.02 µm as a pumping source for this amplification.

A semiconductor laser diode with an oscillation wavelength of about 0.98 µm applied to such an optical fiber usually has a separate confinement heterojunction structure including a GaInAs strained quantum well active layer held between GaAs or GaInAsP barrier layers, and the structure is effective to confine carriers therein. This structure has been applied in order to prevent the threshold current from rising and so forth.

Nevertheless, the reliability required for the semiconductor laser diode used for the pumping source of the optical fiber amplifier is higher than that required for the conventional semiconductor laser diode having the GaInAs active layer and, accordingly, a semiconductor laser diode having a higher reliability is demanded as a pumping source.

An object of the present invention is to provide a semiconductor laser diode which can be applied to optical fiber amplifiers to attain a high reliability and can generate light having a wavelength of about 1 µm. A method of making such a semiconductor laser diode is provided also.

The present invention provides a semiconductor laser diode, which has a GaAs substrate and an active layer formed on the substrate. The active layer is comprised of a GaInAsP strained quantum well layer whose energy band gap is smaller than that of GaAs.

In one aspect, the active layer comprising the GaInAsP strained quantum well has a structure in which a barrier layer comprising GaInAsP whose energy band gap is greater than that of the active layer is formed with heterojunction.

In one aspect, the active layer and the barrier layer have substantially the same composition ratio of Ga:In.

In one aspect, the barrier layer has such a structure that receives, in close proximity to the active layer, a compression strain which is smaller than that applied to the active layer.

In one aspect, a semiconductor window layer whose energy band gap is greater than that of the active layer is grown on an end surface.

In one aspect, the oscillation wavelength of the semiconductor laser diode at room temperature is set not shorter than 0.96 µm.

In one aspect, the semiconductor laser diode is made in such a manner that, when the active layer and the barrier layer are grown, a Ga material and an In material are supplied with constant amounts so that both layers have substantially the same composition ratio of Ga:In.

In one aspect, a portion including said barrier layer and active layer is grown while being held between cladding layers. This portion and the cladding layers are formed by a material containing P.

In one aspect, the semiconductor laser diode is made in such a manner that, when the active layer, the barrier layer, and the cladding layer are grown, a Ga material and an In material are supplied with constant amounts so that all these layers have substantially the same composition ratio of Ga:In.

In the semiconductor laser diode in accordance with the present invention, in comparison to the case where GaInAs is used as an active layer, the amount of strain becomes greater at the same oscillation wavelength, thereby enabling its characteristics to improve due to the strain. This effect becomes greater when the oscillation wavelength is not shorter than 0.96 µm. Also, since each of the active and barrier layers contains P, defects hardly occur at their interfaces during manufacture. Accordingly, the defects can be reduced. Further, since GaInAsP has a carrier-recombining velocity at its interface with a silicon nitride film (coating layer) or the like slower than that of GaInAs, reliability can be improved when an end-surface coating is effected.

When an active layer is grown as GaInAs having a thickness of about 80 angstroms and then, with its Ga:In composition ratio, a GaInAsP barrier layer is grown such that its lattice matches that of a substrate, the energy band gap of the barrier layer becomes so small that the original function (effect) of the barrier may be reduced. On the other hand, when the GaInAsP active layer of the present invention is applied, the energy band gap of the GaInAsP barrier layer can become large even when the Ga:In composition ratio is made constant. When the compositions of Ga and In in the active layer can be substantially the same as those of the barrier layers, the amounts of supply of Ga and In can be maintained at their constant levels. Accordingly, advantageous effects can be obtained in the manufacture in that manufacturing steps can be simplified and so forth.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

The structure of the semiconductor laser diode and method of making the same in accordance with the first embodiment of the present invention will be explained with reference to FIGS. 1A–3.

Figure 1A:
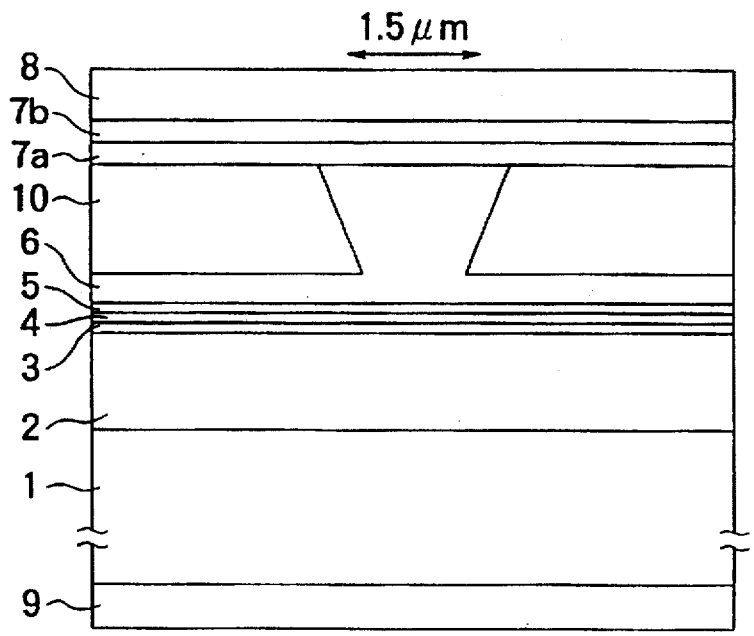
FIG. 1A is a vertical sectional view showing the structure of the semiconductor laser diode in accordance with the first embodiment of the present invention.
Figure 1A:
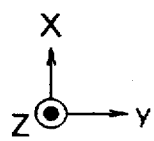

FIG. 1A shows a cross-sectional structure of the semiconductor laser diode in which a direction perpendicular to the cleavage plane of the crystal is indicated as perpendicular direction z, a direction in which each semiconductor layer is superposed is indicated as vertical direction x, and a direction perpendicular to the xy directions is indicated as parallel direction y.

An n-type cladding layer 2 having a thickness of about 2 μm is grown on an n-type GaAs substrate 1. An active layer 4 is sandwiched between a first barrier layer 3 and a second barrier layer 5, and these layers are grown on the n-type cladding layer 2. A compressive stress is applied to the active layer 4.

A p-type cladding layer 6, an n-type current-blocking layer 10, a p-type GaInAsP buffer layer 7a, a p-type GaAs contact layer 7b and a p-type electrode layer 8 are successively formed.

On the back surface of the semiconductor substrate 1, an n-type electrode layer 9 is mounted. Though not depicted, the p-type GaAs contact layer 7b and the p-type electrode layer 8 are not formed within the range of about 20 μm from the periphery of the device of FIG. 1A.

When a part of the p-type GaAs contact layer 7b and p-type electrode layer 8 is removed in this manner, excitation current is prevented from flowing at the end surfaces of the device.

The n-type cladding layer 2 and the p-type cladding layer 6 are composed of AlGaInP. The p-type cladding layer 6 has a flat portion having a thickness of about 0.4 μm which is grown on the second barrier layer 5 as well as a mesa stripe portion having a thickness of about 2 μm and a width of about 1.5 μm. The rest of this layer is removed by photolithography and chemical etching and then the current blocking layer 10 composed of n-AlGaInP, whose crystal has grown again, is formed thereon.

Each of the first and second barrier layers 3, 5 comprises GaInAsP and is grown to a layer thickness of about 340 angstroms. The active layer 4 comprises GaInAsP and is grown to a layer thickness of about 80 angstroms. The other layers are grown by the conventionally-known methods.

The first and second barrier layers 3, 5 and the active layer 4 are grown in the growth conditions shown in the following table I. For comparison, the growth conditions for the GaInAs active layer to obtain an oscillation wavelength of 0.98 μm are also shown as "(Reference)."

Figure 1B:
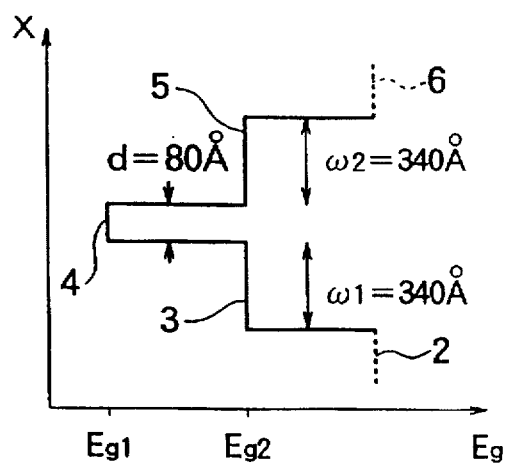
FIGS. 1B and 1C are explanatory views showing profiles of energy band gaps in essential parts of the semiconductor laser diode of FIG. 1A in accordance with the first embodiment.

According to the growth conditions shown in the following table I, the flow rates of TEGa (triethyl gallium) and TMIn (trimethyl indium) supplied from bubblers when the barrier layers 3, 5 are grown are controlled to the same amounts as those supplied when the active layer 4 is grown. On the other hand, the flow rates of AsH₃ and PH₃ when the barrier layers 3, 5 are grown are controlled differently from those supplied when the active layer 4 is grown. Predetermined growth times are set such that the thicknesses $w_1$, $w_2$ of the barrier layers 3, 5 are about 340 angstroms and the thickness d of the active layer 4 is about 80 angstroms. Also, the As:P composition ratio of the barrier layers 3, 5 are made different from that of the active layer 4. When these growth conditions are applied, an oscillation wavelength of about 0.98 μm can be obtained while the barrier layers 3, 5 have a energy band gap $E_{g1}$ which is greater than the energy band gap $E_{g2}$ of the active layer 4 as shown in FIG. 1B on an enlarged scale. Accordingly, the carrier-confining efficiency can be improved.

TABLE I

| | Flow rate of material (cc/m) | | | | Growth | Thick- |
|---|---|---|---|---|---|---|
| | TEGa (20° C.) | TMIn (20° C.) | AsH₃ (10%) | PH₃ (20%) | time (sec) | ness (Å) |
| GaInAsP barrier layer | 50 | 40 | 60 | 500 | 115.6 | 340 |
| GaInAsP well layer | 50 | 40 | 300 | 200 | 27.8 | 80 |
| (Reference) GaInAs well layer | 50 | 25 | 300 | 0 | 29.8 | 80 |

Since the GaInAs active layer shown in the above table I as "(Reference)" does not contain P in the active layer, its condition for controlling the flow rate of TMIn differs from that of this embodiment.

Figure 1C:
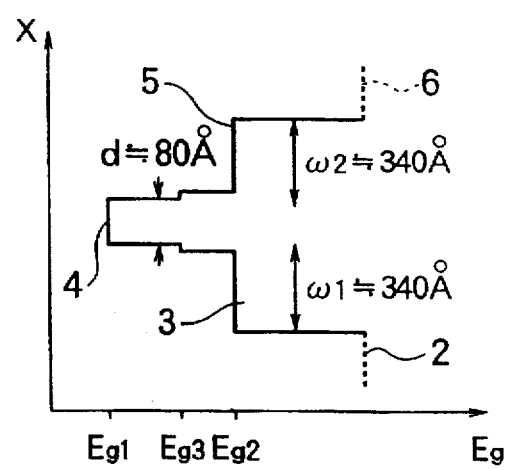

Also, as shown in FIG. 1C on an enlarged scale, the barrier layers 3, 5 may have such a composition that receives, in close proximity to the active layer 4, a compression strain which is smaller than that applied to the active layer 4. In this composition, the close proximity portion can act as a strain-relieving layer which reduces the generation of defects resulting from the strain. Though a composition whose lattice can match that of the substrate is preferable in the proximity portion of the barrier layers 3, 5 in general, a part of the barrier layers 3, 5 may have such a composition that receives tensile strain so as to compensate for accumulated strain. Such a strain compensation is especially effective in cases where there are multiple quantum wells. While the strain-relieving layers are preferably placed on both sides of the active layer 4 as depicted, the above-mentioned effect can also be obtained when the strain-relieving layer is disposed on one side thereof alone.

In the semiconductor laser diode having the above-mentioned structure in accordance with this embodiment of the present invention, the following effects can further be obtained.

In general, when a material belonging to the V group is grown by $AsH_3$ and $PH_3$ in the process for making a semiconductor laser diode, their flow rates can be controlled relatively easily since they are gases and their flow rates to be supplied are large. On the other hand, when a material belonging to the III group is grown by TEGa and TMIn, they have to turn into gases by bubbling since they are intrinsically liquids. Accordingly, it is difficult to control their flow rates. Further, since their flow rates are set to small values, it takes a long time for the flow rates to be stabilized after being changed.

Therefore, as in the case of the prior art indicated as "(Reference)" in the above table I, when the flow rates of TEGa and TMIn have to be controlled by being switched between when the barrier layer is grown and when the active layer is grown, a long interval (interruption) is necessary for stabilizing the flow rates and thus the layers cannot be manufactured rapidly.

As shown in the above table I, on the other hand, in order to realize the thicknesses and compositions of the barrier layers 3, 5 and the active layer 4 for obtaining a desired oscillation wavelength in the structure in accordance with this embodiment, it is sufficient for the flow rates of TEGa and TMIn to be constantly maintained (i.e. it is not necessary for their flow rates to be changed), while controlling the flow rates of $AsH_3$ and $PH_3$ which are easy to control, when the barrier layers 3, 5 and the active layer 4 are grown, since all these layers contain P.

Accordingly, when the semiconductor laser diode structure of this embodiment is applied, a long-time interruption of growth as in the case of the prior art is not necessary. Thus, the contamination on the surface during the interruption of growth can be minimized. While an interruption of several minutes is necessary in the prior art for the flow rates of TEGa and TMIn in a reactor to stabilize after being controlled by switching, it only takes an interruption of 3 seconds or less in this embodiment for the flow rates of $AsH_3$ and $PH_3$ in the reactor to stabilize after being controlled by switching. Thus, the time required for the manufacturing process can be shortened greatly. This advantageous effect can be obtained in the manufacturing processes of both OMVPE and MBE.

Also, the prior art has a problem that, when an active layer containing no P and a barrier layer containing P are grown, defects are likely to be introduced in the interface therebetween. In this embodiment, on the other hand, since all the barrier layers 3, 5 and the active layer 4 contain P, these defects can be reduced greatly so as to realize a semiconductor laser diode having a high reliability and an improved performance.

Figure 2:
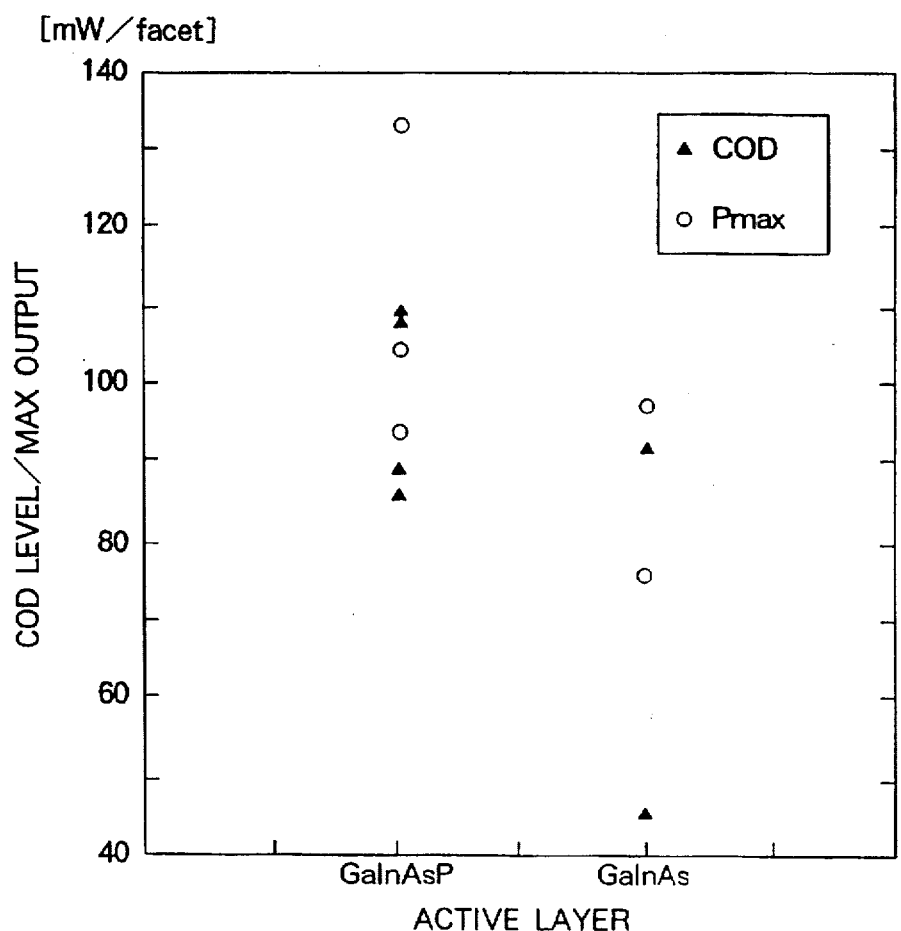
FIG. 2 is a chart comparing the characteristics of the semiconductor laser diode in accordance with the first embodiment with those of a semiconductor laser diode having GaInAs active layer.

FIG. 2 shows a comparison of the characteristics of the semiconductor laser diode having a GaInAs active layer with the those of the semiconductor laser diode having a GaInAsP active layer in accordance with this embodiment as confirmed by the following experiments. The oscillation wavelength of each semiconductor laser diode is about 0.98 μm.

In the first place, an excitation current of 500 mA was supplied to a plurality of samples of semiconductor laser diodes at an ambient temperature of 25° C. Only those working correctly were selected from these samples and then subjected to a burn-in for 100 hours in which an excitation current of 275 mA was supplied thereto at an ambient temperature of 50° C.

While the ambient temperature is maintained at 50° C. and the excitation current is set to 500 mA at maximum, the optical output characteristic with respect to the current was determined. The chart shows the COD levels (indicated as "o" in the drawing) and the maximum output levels (indicated as "☐" in the drawing ) of the laser diodes in which no COD occurred. As clearly shown in this chart, it has been empirically confirmed that the semiconductor laser diode having a GaInAsP active layer in accordance with this embodiment exhibits a characteristic which is clearly better than that of the semiconductor laser diode having GaInAs active layer.

Figure 3:
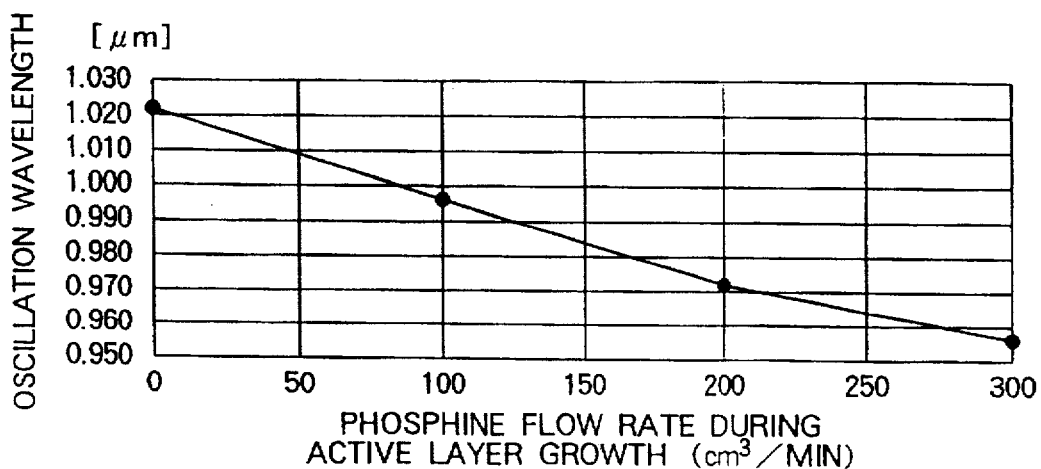
FIG. 3 is an explanatory view showing an example of the method of making the semiconductor laser diode in accordance with the first embodiment.

In this embodiment, as a method for eliminating the difficulty in accurately controlling the growth of the active layer 4 having a thickness of 80 angstroms, the following technique may preferably be used. Namely, FIG. 3 shows the dependence of the room-temperature photoluminescence wavelength of the GaInAsP strained quantum well on the $PH_3$ flow rate obtained when the same conditions as those of GaInAsP of this embodiment are used except for the flow rate of $PH_3$ and the thickness. When such data are empirically be obtained and then the active layer of GaInAsP is grown on the basis of these data, a semiconductor laser diode having a desired oscillation wavelength can be manufactured even when the thickness d of the active layer is uncertain (i.e. it is not exactly the thickness of d=80 angstroms).

The composition ratio, the carrier concentration and the thickness of each layer are shown in table II.

TABLE II

| | 1. material<br>2. composition ratio<br>3. range<br>4. energy band gap: Eg | 1. conduction type<br>2. dopant<br>3. carrier concentration at room temp. $(cm^{-3})$: n<br>4. range | 1. thickness: d (nm)<br>2. range |
|---|---|---|---|
| substrate 1 | 1. $Ga_xAs_y$<br>2. X = 1, Y = 1<br>4. Eg = 1.47 eV | 1. n-type<br>2. Si<br>3. n = $2 \times 10^{18}$<br>$4.1 \times 10^{18} < n < 4 \times 10^{18}$ | 1. d = $70 \times 10^3$<br>2. $50 \times 10^3 <$ d $< 120 \times 10^3$ |
| cladding layer 2 | 1. $(Al_xGa_{1-x})_{0.5}In_{0.5}P$<br>2. X = 0<br>3. $0 \leq x \leq 1$ | 1. n-type<br>2. Si<br>3. n = $1 \times 10^{18}$<br>4. $1 \times 10^{17} \leq n \leq 2 \times 10^{18}$ | 1. d = $2 \times 10^3$<br>2. $1 \times 10^3 \leq$ d $\leq 2.5 \times 10^3$ |
| barrier layer 3 | 1. GaInAsP<br>4. Eg (barrier layer 3)<br>< Eg (active layer 4) | 1. n or p-type<br>2. undoped, Si or Zn<br>3. n = $5 \times 10^{16}$<br>4. n <$1 \times 10^{17}$ | 1. d = 34<br>2. $20 \leq$ d $\leq 200$ |
| active layer 4 | 1. GaInAsP<br>4. Eg < 1.47 | 1. n or p-type<br>2. undoped, Si or Zn<br>3. n = $5 \times 10^{16}$<br>4. n < $1 \times 10^{17}$ | 1. d = 8<br>2. $2 \leq$ d $\leq 15$,<br>(d < critical thickness) |
| barrier layer 5 | 1. GaInAsP<br>4. Eg (barrier layer 3)<br>< Eg (active | 1. n or p-type<br>2. undoped, Si or Zn<br>3. n = $5 \times 10^{16}$ | 1. d = 34<br>2. $20 \leq$ d $\leq 200$ |

TABLE II-continued

| | 1. material<br>2. composition ratio<br>3. range<br>4. energy band gap: Eg | 1. conduction type<br>2. dopant<br>3. carrier concentration at room temp. (cm$^{-3}$): n<br>4. range | 1. thickness: d (nm)<br>2. range |
|---|---|---|---|
| | layer 4) | 4. n < 1 × 10$^{17}$ | |
| cladding layer 6 | 1. (Al$_x$Ga$_{1-x}$)$_{0.5}$In$_{0.5}$P<br>2. X = 0<br>3. 0 ≦ x ≦ 1 | 1. p-type<br>2. Zn<br>3. P = 1 × 10$^{18}$<br>4. 4 × 10$^{1}$ ≦ n ≦ 2 × 10$^{18}$ | 1. d = 2 × 10$^3$<br>2. 1 × 10$^3$ ≦ d ≦ 2.5 × 10$^3$ |
| buffer layer 7a | 1. GaInAsP<br>4. Eg (layer 7b) < Eg (layer 7a) < Eg (layer 6) | 1. p-type<br>2. Zn | 1. d = 40<br>2. 10 ≦ d ≦ 100 |
| contact layer 7b | 1. GaAs<br>4. Eg = 1.47 | 1. p-type<br>2. Zn<br>3. 2 × 10$^{19}$<br>4. 1 × 10$^{19}$ ≦ n ≦ 3 × 10$^{19}$ | 1. d = 1 × 10$^3$<br>2. 0.1 × 10$^3$ ≦ d ≦ 4 × 10$^3$ |
| current-blocking layer 10 | 1. (Al$_x$Ga$_{1-x}$)$_{0.5}$In$_{0.5}$P<br>2. X = 0.2<br>3. 0 ≦ x ≦ 1 | 1. n-type<br>2. Si<br>3. n = 5 × 10$^{17}$<br>4. 1 × 10$^{17}$ ≦ n ≦ 2 × 10$^{18}$ | 1. d = 1.6 × 10$^3$<br>2. 0.2 × 10$^3$ ≦ d ≦ 2 × 10$^3$ |
| coating layer 13 | 1. GaAs or Ga$_{0.5}$In$_{0.5}$P | 1. n or p-type<br>2. undoped, Si or Zn<br>3. n = 5 × 10$^{16}$<br>4. n < 1 × 10$^{17}$ | 1. d = 0.1 × 10$^3$<br>2. 0.05 × 10$^3$ ≦ d ≦ 3 × 10$^3$ |

In the following, the second embodiment of the present invention will be explained with reference to FIGS. 4 and 5. In this embodiment, the composition ratio of a part of the cladding layers 2, 6 shown in FIG. 1A is changed so as to generate an energy band gap $E_g$ shown in FIG. 4, while the rest of layer structure (the first and second barrier layers 3, 5 and the active layer 4, in particular) are the same as those of the first embodiment. Namely, the main portion of the cladding layers 2, 6 is composed of (Al$_{0.1}$Ga$_{0.9}$)$_{0.5}$In$_{0.5}$P, while (Al$_{0.9}$Ga$_{0.1}$)$_{0.57}$In$_{0.43}$P is grown in a part of the cladding layer 2 so as to realize a wide energy band gap $E_g$. Since such a wide energy band gap is set, carriers in the active layer 4 are prevented from overflowing. Also, since the In composition in this part of the layer is set low to receive tensile strain, the barrier effect with respect to the carriers is increased.

Further, since this part of the layer does not directly contact with the active layer 4 but the same energy band gap as that in the rest of the cladding layer 2 is interposed therebetween, carrier loss is prevented.

Figure 5:
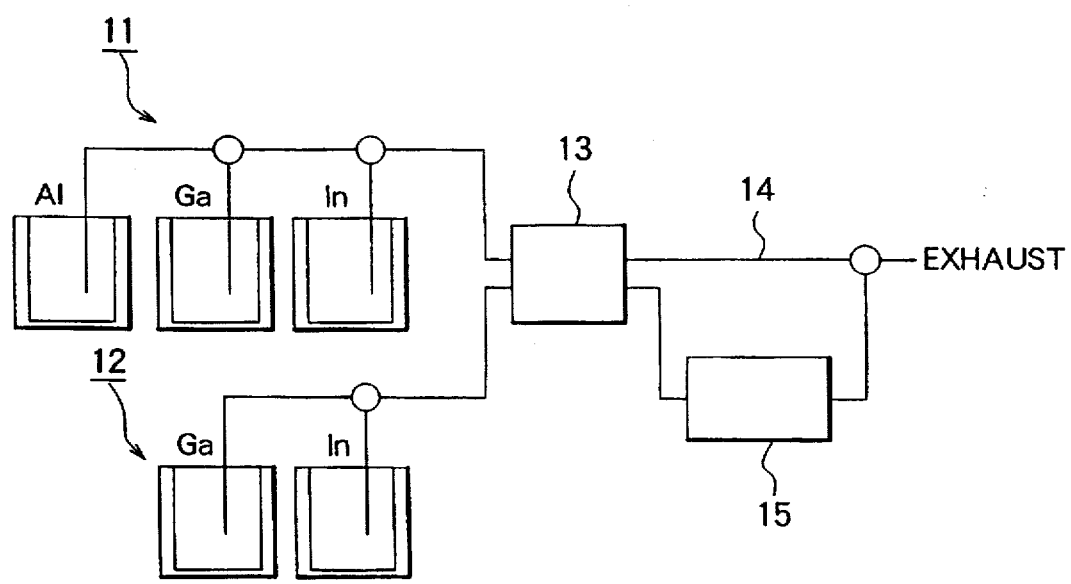
FIG. 5 is an explanatory view showing an example of making the semiconductor laser diode in accordance with the second embodiment.
Figure 6:
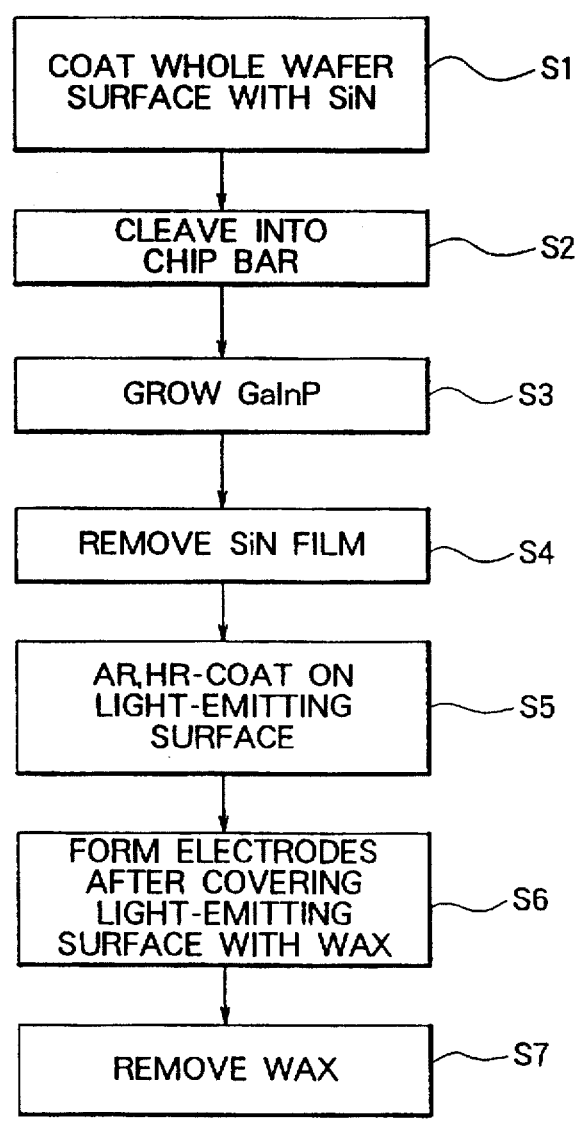
FIG. 6 is a flow chart showing the steps in the method of making the semiconductor laser diode in accordance with the third embodiment of the present invention.

FIG. 5 shows the configuration of an apparatus for making the semiconductor laser diode having the structure explained above. The systems for supplying AsH$_3$ and PH$_3$ are not depicted in this drawing. This apparatus has a first bubbler 1, which applies OMVPE and is used for growing the cladding layers 2, 6 containing Al, and a second bubbler 12, which is independent from the first bubbler 11 and used for growing the first and second barrier layers 3, 5 and active layer 4 containing no Al.

By way of a switching device 13, the bubblers 11, 12 are piped to a reactor 15. Also, a bypass pipe 14 is connected to the switching device 13. Exhaust is discharged at the ends of the reactor 15 and bypass pipe 14.

In the first place, in order to grow the cladding layer 2, the switching device 13 is switched so as to connect the first bubbler 11 to the reactor 15 while disconnecting the second bubbler 12. The cladding layer 2 containing Al shown in FIG. 4 is thus grown. Then, the second bubbler 12 is connected to the reactor 15 while disconnecting the first bubbler 11. The first and second barrier layers 3, 5 and active layer 4 containing no Al shown in FIG. 4 are thus grown.

Thereafter, the switching device 13 is switched so as to connect the first bubbler 11 to the reactor 15 while disconnecting the second bubbler 12. The cladding layer 6 containing Al shown in FIG. 4 is thus grown. The rest of the layers are grown by the conventional OMVPE method.

Since the two systems of the first and second bubblers 11, 12 are switched by the switching device 13, the flow rate of each material can be controlled more accurately than the case where a single bubbler system is applied so as to attain the same object.

Namely, in the single bubbler system, Al is not actually purged when the mass flow controller (MFC) of Al is disconnected, since Al remaining within the pipe can flow into the reactor 15. In this embodiment, on the other hand, the barrier layers 3, 5 and active layer 4 containing no Al can be grown since the connections of the first and second bubblers 11, 12 to the reactor 15 are rapidly switched by the switching device 13.

Figure 4:
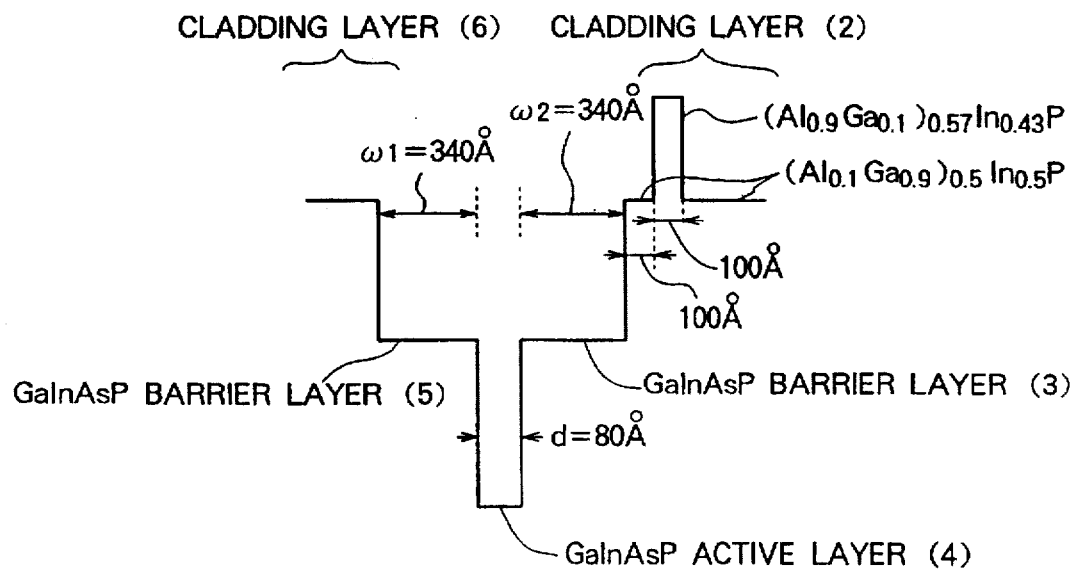
FIG. 4 is an explanatory view showing the structure of the semiconductor laser diode in accordance with the second embodiment of the present invention with reference to a profile of energy band gaps in essential parts thereof.

Further, in this embodiment, since this switching operation can realize an steep profile as shown in FIG. 4, semiconductor laser diodes having uniform characteristics can be made.

In this embodiment, as in the case of the first embodiment, the first and second barrier layers 3, 5 and the active layer 4 contain P. Accordingly, like the growth conditions shown in the above table, the flow rates of TEGa and TMIn for growing the GaInAsP barrier layers 3, 5 can be maintained at the same levels as those for growing the GaInAsP active layer 4, thereby simplifying the process control and the like.

Further, when such two bubbler systems are applied, the strain of the active layer 4 can be adjusted while maintaining the compositions of the barrier layers 3, 5 as they are. Namely, when the flow rates of TEGa and TMIn are independently adjusted so as to increase or decrease their levels beforehand and then the flow rate of PH$_3$ is controlled on the basis of the data such as those shown in FIG. 3, each layer can grow such that a semiconductor laser diode having a desired oscillation wavelength is easily made.

In the following, the third embodiment of the present invention will be explained with reference to FIGS. 6 and 7A–7C. This is a further embodiment concerning the method of making the semiconductor laser diode. FIGS. 6 and 7A–7C show the steps of the process and the device structures corresponding to these steps, respectively.

After a wafer-like device (an intermediate product) having a structure such as the one shown in FIG. 1A is made, the whole surface of the wafer is coated with a silicon nitride (SiN) film 111 in the first step S1 before external electrodes are attached to the p-type electrode layer 8 and the n-type electrode layer 9. In the second step S2, the silicon nitride coated wafer is cleaved into a resonator length of about 1.5 mm so as to produce a so-called chip bar (cf. FIG. 7A).

The chip bar 112 has two cleavage planes 112a and 112b opposing each other, and the resonator length is defined by the distance between the cleavage planes 112a and 112b.

In the third step S3, while the chip bar 112 is placed such that the end surface coated with the silicon nitride film (SiN) 111, i.e. one of the end surfaces where the electrode layers 8, 9 are to be formed, is on the upside, a GaInP window layer 113 having a thickness of 1000 angstroms is grown on the cleavage surfaces 112a and 112b by OMVPE. The end surfaces 112a and 112b of the active layer 4 is covered by the window layer 113.

Further, in a $PH_3$ atmosphere, the temperature is raised after being set as low as about 600° C. at least at the beginning of the growth. At this stage, since the first and second barrier layers 3, 5 and the active layer 4 contain P, the substitution between As and P is alleviated, thereby reducing the deterioration of the characteristics. Also, when the chip bar 112 is placed as noted above, a GaInP window layer can be grown on the whole cleavage surfaces 112a–112d in a single step (cf. FIG. 7B).

In the fourth step S4, the silicon nitride film 111 is removed.

In the fifth step S5, the cleavage surfaces are subjected to AR and HR coatings such that a film having a low reflectivity is formed on the light-emitting end while a film having a high reflectivity is formed on the rear end.

Figure 7A:
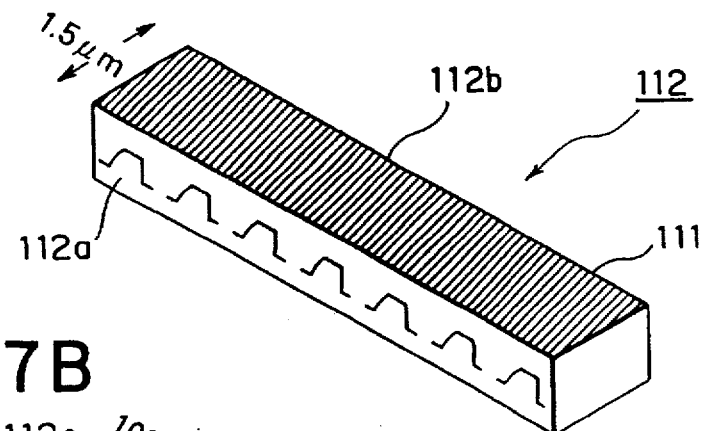
FIGS. 7A–7C are explanatory views showing the device structures according to the flow chart of FIG. 6.
Figure 7B:
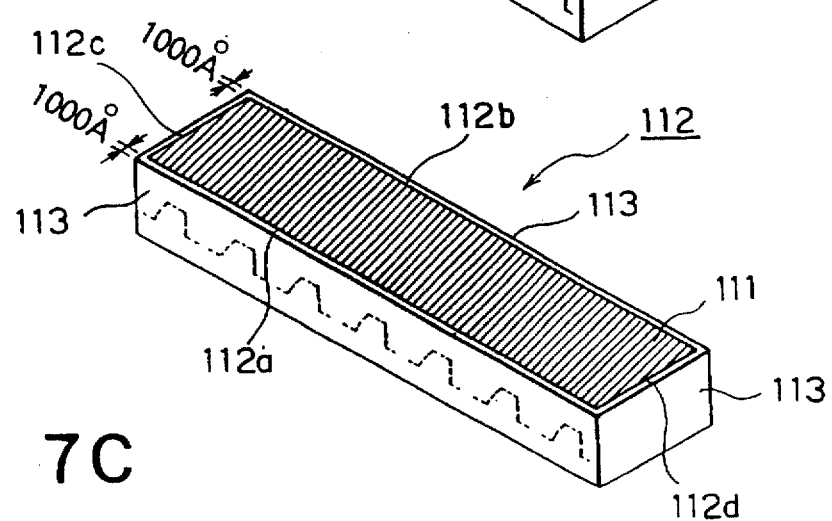
Figure 7C:
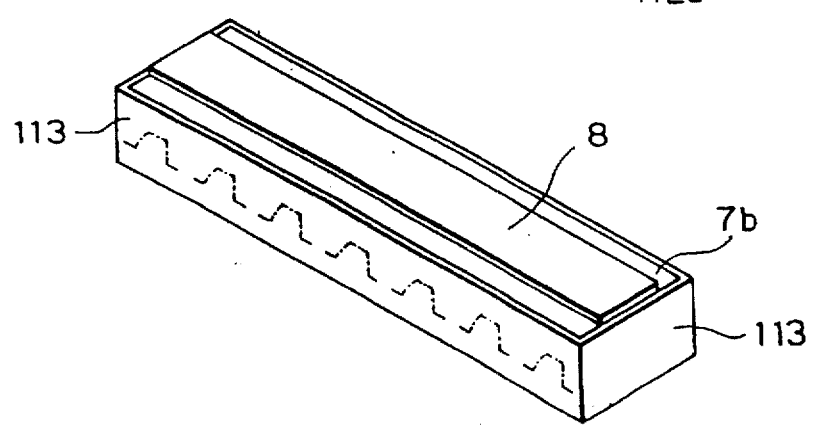

In the sixth step S6, wax is applied to the light-emitting end 112a, side ends 112c and 112d, and rear end 112b and then the p-type electrode layer 8 and the n-type electrode layer 9 are formed on the surfaces not coated with wax (i.e. the surfaces perpendicular to direction x) by ohmic formation (cf. FIG. 7C).

Finally, in the seventh step S7, the above-mentioned wax is removed. In cases where a small amount of wax has been attached, in the sixth step S6, to the end surfaces where the p-type electrode layer 8 and the n-electrode layer 9 are to be formed by ohmic formation, such wax is dissolved by acetone and an alloy of the ohmic electrode is made.

These manufacturing steps can yield the following results. In general, the end surface of the light-emitting portion is likely to break when the light-emitting power is high. Accordingly, a GaInP window layer may be formed on the light-emitting end surface.

However, in cases where the intermediate product on which the electrode layers 8, 9 have been formed is cleaved into a chip bar and then the GaInP window layer is formed, the chip bar on which the electrode layers 8, 9 have been formed has to be introduced into a reaction furnace. On the other hand, in accordance with the manufacturing steps of this embodiment, a semiconductor laser diode having a desired structure can be made without necessitating such a procedure.

As explained in the foregoing, the present invention using the GaInAsP active layer yields an amount of strain greater than that obtained at the same oscillation wavelength when the GaInAs active layer is used. Accordingly, the characteristics can be improved by strain. In particular, this effect becomes greater when the oscillation wavelength is not shorter than 0.96 μm.

Also, since each of the active and barrier layers contains P, defects are hard to occur at their interfaces during the manufacture and thus such defects can be reduced.

Further, since GaInAsP has a carrier-recombining speed at its interface with a silicon nitride film slower than that of GaInAs, reliability can be improved when an end-surface coating is effected.

When an active layer is grown as GaInAs having a thickness of about 80 angstroms and then, with its Ga:In composition ratio, a GaInAsP barrier layer is grown such that its lattice matches that of a substrate, the energy band gap of the barrier layer becomes so small that the original effect of the barrier may be reduced.

On the other hand, when the GaInAsP active layer of the present invention is applied, the energy band gap of the GaInAsP barrier layer can become large even when the Ga:In composition ratio is made constant. When the compositions of Ga and In in the active and barrier layers can be made substantially the same, the amounts of supply of Ga and In can be maintained at constant levels.

Accordingly, advantageous effects can be obtained in the manufacture in that manufacturing steps can be simplified and so forth.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 210097/1994 (6-210097) filed on Sep. 2, 1994, is hereby incorporated by reference.

What is claimed is:

1. A semiconductor laser diode comprising:
   a substrate of GaAs; and
   an active layer formed on said substrate, having a GaInAsP compressive strained quantum well whose energy band gap is smaller than that of GaAs.

2. A semiconductor laser diode according to claim 1, further comprising a barrier layer of GaInAsP whose energy band gap is greater than that of said active layer.

3. A semiconductor laser diode according to claim 2, wherein said active layer and said barrier layer have the same composition ratio of Ga to In.

4. A semiconductor laser diode according to claim 3, wherein said barrier layer has such a structure that receives, in close proximity to said active layer, a compressive strain which is smaller than that applied to said active layer.

5. A semiconductor laser diode according to claim 1, further comprising a pair of cladding layers which sandwich a portion including said barrier layer and active layer, wherein said portion and said cladding layers are comprised of material containing P.

6. A semiconductor laser diode according to claim 1, further comprising a semiconductor window layer provided on a cleavage plane of said active layer, wherein the energy band gap of said semiconductor window layer is greater than that of said active layer.

7. A semiconductor laser diode according to claim 1, wherein said semiconductor laser diode has an oscillation wavelength at room temperature set not shorter than 0.96 μm.

* * * * *